United States Patent [19]

Sullivan

[11] Patent Number: 4,752,553

[45] Date of Patent: Jun. 21, 1988

[54] HIGH RESOLUTION SOLDER MASK PHOTOPOLYMERS FOR SCREEN COATING OVER CIRCUIT TRACES

[75] Inventor: Donald F. Sullivan, King of Prussia, Pa.

[73] Assignee: M&T Chemicals Inc., Woodbridge, N.J.

[21] Appl. No.: 650,109

[22] Filed: Sep. 13, 1984

Related U.S. Application Data

[63] Continuation-in-part of Ser. No. 364,309, Apr. 1, 1982, Pat. No. 4,506,004.

[51] Int. Cl.$^4$ .............................................. G03C 1/76
[52] U.S. Cl. ..................................... 430/271; 430/280; 430/281; 430/284; 430/287; 430/288; 430/935; 522/96; 522/135
[58] Field of Search ............... 430/270, 284, 311, 327, 430/281, 287, 280, 288, 271, 935; 522/96, 135

[56] References Cited

U.S. PATENT DOCUMENTS

| | | | |
|---|---|---|---|
| 3,824,104 | 7/1974 | Kloczewski et al. | 430/284 |
| 4,011,084 | 3/1977 | Hartmann et al. | 430/284 X |
| 4,087,182 | 5/1978 | Aiba et al. | 355/100 |
| 4,260,675 | 4/1981 | Sullivan | 430/315 |
| 4,291,118 | 9/1981 | Boduch et al. | 430/313 |
| 4,376,815 | 3/1983 | Oddi et al. | 430/313 |
| 4,378,411 | 3/1983 | Heilmann et al. | 428/500 |
| 4,413,051 | 11/1983 | Thomas | 430/312 |
| 4,424,089 | 1/1984 | Sullivan | 156/155 |
| 4,510,276 | 4/1985 | Leech et al. | 523/427 |
| 4,528,261 | 7/1985 | Hauser | 430/322 |

FOREIGN PATENT DOCUMENTS

741470 12/1955 United Kingdom ................ 430/396

*Primary Examiner*—John E. Kittle
*Assistant Examiner*—José G. Dees
*Attorney, Agent, or Firm*—S. A. Marcus; S. A. Parker; R. E. Bright

[57] ABSTRACT

High photo resolution of over 100 lines is obtained for solder masks of thicknesses greater than 0.002 in. (0.005 cm) with liquid photopolymers of special compositions deposited from mesh screens over printed wiring board traces and photoexposed with a phototool image in contact with the photopolymer. Special interrelated properties of the liquid photopolymer interacting in an explicit process of screen depositing two adjacent liquid polymer layers include freedom from volatiles, a paste-like viscosity permitting use with mesh screens of about 60 mesh to obtain a uniform thickness layer free of bubbles and mesh marks, solder mask insulator and heat resistance characteristics, an ability to photo flash through a phototool image in contact with one layer surface and the other surface exposed to air to polymerize through a significant thickness of about one-third of the layer thickness, photo response to polymerize to a depth of about 0.02 in. (0.05 cm) when exposed to about 1 joule per square cm, absence of ingredients refracting, blocking or reflecting the actinic radiation and good adherence to copper wiring. These properties react in the process of bubble-free lamination of two paste consistency layers, a first to cover uneven wiring traces and a second to provide a flat photo-image surface, thereby to achieve thicknesses of about 0.006 in. (0.015 cm) for covering wiring traces 0.004 in. (0.001 cm) thick with assurance of a covering of 0.002 in. (0.005 cm) thickness over all wiring traces. This is achieved by photo flashing the uppermost layer through a photo-image with one surface exposed to air to polymerize a surface layer that covers the traces permitting the unpolymerized liquid paste surface to meet in bubble-free surface contact with an initial layer deposited directly over the wiring traces.

11 Claims, 2 Drawing Sheets

HIGH RESOLUTION SOLDER MASK PHOTOPOLYMERS FOR SCREEN COATING OVER CIRCUIT TRACES

TECHNICAL FIELD

This invention relates to printed wiring boards, and more particularly it relates to thick liquid photopolymer solder mask coatings of more than 0.002 in (0.005 cm) with high resolution in-situ photo imaging characteristics and flow characteristics for covering of printed circuit board wiring traces.

BACKGROUND ART

This application is a continuation-in-part of my copending application for Printed Wiring Board, Ser. No. 364,309 filed Apr. 1, 1982, now U.S. Pat. No. 4,506,004 dated Mar. 19, 1985, and includes that application herein in its entirety by reference.

As set forth in my U.S. Pat. No. 4,424,089 issued Jan. 3, 1984, liquid photopolymer of paste-like consistency may be deposited to a desired thickness by screen printing. However, a loss of photo imaging resolution results for thicker layers. It is also shown therein that uniform thickness and very smooth surface of the polymer is desirable. Bubbles and surface screen marks are common flaws encountered when screening with liquid polymers. Also it has been found that conventional photopolymer coatings, such as those described in the literature and those presently available commercially, when deposited on a printed circuit wiring board over circuit traces of 0.002 in. (0.005 cm) thickness or greater with typical 0.012 in. (0.04 cm) width traces spaced by 0.012 in. spacings are subject to starvation or thinning of the coating over the traces, leading to unsatisfactory solder mask insulating properties. It is desirable to use a negative acting liquid photopolymer, which is low in cost and provides good solder coating characteristics.

Commercially available photopolymers of this nature, such as those identified in my U.S. Pat. No. 4,260,675 of Apr. 7, 1981, however, neither provide the proper viscosity nor resolution to produce high quality solder mask coatings of thicknesses up to 0.006 in. (0.015 cm) as set forth in my parent patent. For thick solder mask layers of high resolution therefore, it has been necessary to use expensive dry film such as taught by U.S. Pat. No. 4,413,051 to L. E. Thomas, dated Nov. 1, 1983.

The technique of transferring very thin layers of light sensitive, preferably positive acting, photoresist of several microns thickness from screens onto printed circuit boards is set forth in U.S. Pat. No. 4,376,815, M. J. Oddi, et al., of Mar. 15, 1983. The technique depends on a very thin layer of special photoresists containing volatile solvents which need be heat dried to remove solvents before photo imaging. Also because of very thin viscosity, even with tight mesh screens, these resists require special techniques such as misregistration of successive printed wiring boards to keep from dripping off drops of liquid resist in the presence of through holes in the printed wiring boards. Also because of these very low viscosities, thicker film layers such as 0.002 in. (0.005 cm) to 0.006 in. (0.015 cm) could not be screen deposited. Furthermore, thin viscosity liquid resists run off the wiring traces to produce inadequate solder mask thickness or starvation over closely spaced narrow printed wiring traces. This particular photoresist need be altered for flow characteristics by increasing the percentage of solids to solvent or by the addition of fillers so that the photoresist does not run through the very fine mesh screen or run off the smooth surface of the substrate while heat drying to remove the solvent. The diazo photo resists used are not suitable for photo imaging in the liquid state with solvents present, and thus the interspersed heat drying cycle makes this technique unsuitable economically for competitive printed wiring board usage to compete with thicker dry film layers and better photo imaging resolutions such as available for use as permanent solder mask coatings photo developed in-situ on printed wiring boards, even if were known how thicker layers of the solvent containing resist could be processed and could be photo imaged with high resolution.

To attain thick coatings of photo resists such as 0.005 in. (0.013 cm) is a problem in the art as shown in U.S. Pat. No. 4,413,051, supra, particularly when high photo imaging resolution is required. Thus, it is not known in the art before my invention how to build up liquid photoresists capable of remaining in-situ without a processing step before photo imaging when thicknesses of more than about 0.0005 in. (0.0013 cm) are required, nor is it known how to obtain high photo resolution from thick liquid photo resist layers.

The use of liquid photo polymers to attain thicker layers such as 0.003 in. (0.008 cm) by an intermediate exposure step to polymerize the liquid polymer layer in place on a printed circuit board before photo imaging is set forth in U.S. Pat. No. 4,291,118, P. Boduch et al., of Sept. 22, 1981. Thus, an intermediate actinic radiation exposure step is necessary in order to hold the liquid photopolymer layer in place, and a difficult air knife spreading step for the liquid polymer is required during radiation results in a costly process and costly tooling. The system becomes critical and resolution diminishes when a polymer is partially prepolymerized. Even so this process cannot be used on boards with circuit traces to produce minimum thickness coatings over circuit traces.

As seen from British Patent Specification No. 741,470, E. I. Du Pont, published Dec. 7, 1955, it is conventional in the liquid photopolymers that to attain thicker layers, the intermediate photo polymerization step is required before photo imaging, or alternatively, the liquid has added fillers of silicon or the like, which can diffract actinic light and therefore disturb resolution. Problems are encountered in keeping the liquid layer flat and constant in thickness during polymerization. These techniques are developed for the purpose of obtaining half tone images and very poor resolution is attained, because of diverging radiation in the photopolymer to form conical sides rather than sharp straight sides required in photo imaging of solder masks onto modern high resolution printed wiring boards.

In my parent application, the thickness of about 0.006 in. (0.015 cm) is attained by superimposing two thinner layers of liquid photopolymer of paste-like consistency each deposited from a screen to control thickness. The objective of bubble free adhering contact at the substrate and inner layer surfaces and a smooth bubble free outer surface is necessary to produce high resolution photo images. However, this objective has been found to be critically related not only to critical photo qualities of the polymer for attaining high resolution photo imaging, but also to the viscosity of the photopolymer. No available photopolymers of satisfactory viscosity and photo qualities existed in the published arts or available commercial polymers for high resolution photo imaging of permanent solder mask coatings directly on liquid photopolymer coatings placed on the substrate. Thus it was found that the available liquid negative acting photopolymers were either very thin for the production of thin layers or very thick and containing fillers or additives which could refract or diffuse actinic light and thus limit resolution and/or curing depth, particularly in layers as thick as 0.004 in. (0.01 cm) to 0.006 in. (0.015 cm).

It is an object of this invention to overcome the deficiencies of this prior art and to provide improved liquid photopolymer solder mask resists for producing with screen depositing through coarse screens smooth bubble free surfaces and high photo imaging resolution throughout thickness ranges of the order of 0.002 in. (0.005 cm) to 0.006 in. (0.015 cm). Thus, in situ coatings are desired to photo develop for obtaining high resolution patterns permanently covering printed wiring traces on printed wiring boards. The liquid polymer coatings need be photo imagable in place in liquid polymer form and controllable by screen printing to attain desired layer thicknesses and proper flow characteristics over rough substrate terrain afforded by wiring traces thereon of thicknesses up to about 0.005 in. (0.013 cm).

DISCLOSURE OF THE INVENTION

Thus, this invention provides a negative acting liquid photopolymer of photo imaging quality with substantially 100% non-volatiles comprising a mixture of monomers, polymers, a photo sensitizer and, if desired, a surfactant reducing the tendency to develop and retain air bubbles with all ingredients and fillers having transparent optical properties in the presence of actinic radiation used for polymerization that limit refracting or diffusing. The polymer has a critical viscosity explicitly for mesh screen deposit from 50 to 120 mesh screens to produce layers of constant thickness therefrom in the order of 0.002 in. (0.005 cm) to 0.003 in. (0.008 cm) without plugging or dripping through screen or circuit board holes or creating bubbles left after the screening process, and free of any screen mesh marks or ridges on the surface and which flows over circuit traces on a circuit board substrate without entrapping air bubbles alongside the circuit traces.

This photopolymer further has the photo imaging properties of producing resolutions up to at least 125 lines when two screen deposited layers are superimposed at a thickness of 0.006 in. (0.015 cm). This is attained in part by absence of any fillers or ingredients that significantly diffuse or diffract actinic light used to expose the photopolymer. The photo characteristics further have the property of efficient low energy and rapid polymerization from actinic light for attaining efficient production costs and speeds. They have the property of being polymerizable to selected depths when one surface is open to air when radiated, and thus assure tenting of through holes and adequate solder mask insulation over narrow traces in present day printed wiring boards. The fully polymerized and cured photopolymer is of good insulating properties and heat resistance to reside in place on a printed wiring board when exposed in liquid form to serve as a permanent solder mask.

Thus, printed wiring boards have deposited thereon with these critical polymer features thick bubble-free high-resolution photopolymer layers of uniform and controlled thickness fully transparent to actinic light for exposing the photopolymer, whether on flat surfaces, substrate surfaces or over closely spaced fine wiring traces in the conductive layer superimposed on an insulating substrate. These layers are deposited by transfer through a coarse screen with a mesh between 50 and 120. Two superimposed layers with the critical viscosity of the photopolymer provide surface to surface liquid polymer contact in the unpolymerized state serving to prevent bubbles. The surfaces are free from bubbles and screen mesh marks that would disturb photo imaging resolution. A key feature permitted by the photopolymer properties is the ability to lay down with coarse screens one or more controlled thickness layers of liquid photopolymer of a paste-like consistency on a printed wiring board for high resolution photo imaging directly in its liquid form without intermediate steps of drying or polymerization. The viscosity of the liquid photopolymer is such that it neither runs off the board nor is hardened or abrasive enough to prevent repeated direct contact of the photopolymer in situ with a phototool emulsion surface to obtain high resolution contact printing. Under these circumstances, the photopolymer provides good phototool wear properties.

THE PREFERRED EMBODIMENT

Figure 1:
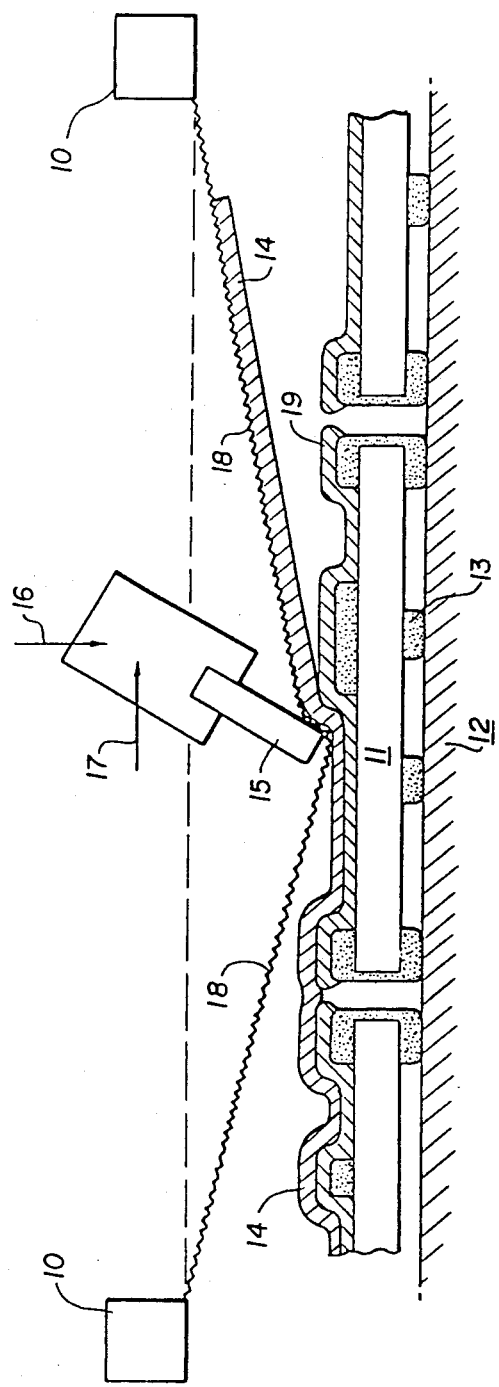
FIG. 1 is a diagrammatic view of a process of coating a printed wiring board with a two layer solder mask coating from a mesh screen.

As seen from FIG. 1, a mesh screen is held between members 10 in a parallel postion over the printed wiring board 11 resting on work surface 12 in order to superimpose on wiring traces 13 and initial photopolymer coating layer 19, a second layer 14, which is deposited from mesh screen 18 by means of the rubber blade 15 under influence of forces 16 and 17.

Figure 2:
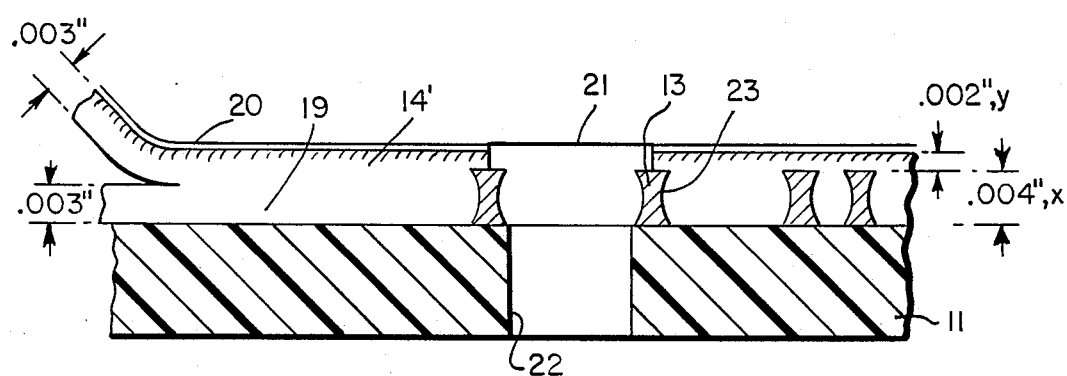
FIG. 2 is a fragmental view of a printed wiring board with a solder mask coating of liquid photopolymer having unique properties specifically adapted to cover printed wiring traces and produce high resolution photo images.

As may be seen from FIG. 2, an alternative intermediate step may be taken to provide a flush top surface upon which the phototool image pattern 20 is superimposed with the emulsion side in contact with the upper surface of the liquid photopolymer layer 14'. Thus as indicated by the partial hatching through its depth of 0.003 in. (0.007 cm), the upper layer 14' is partially polymerized to a depth of about 0.002 in. (0.005 cm). Thus the upper layer 14' is a liquid photopolymer layer having photo properties such that when a substantially constant thickness layer greater than about 0.002 in (0.005 cm) thick has only one surface exposed to the presence of air and the other surface in contact with the phototrasparency 20 carrying an image such as at 21 covering the through hole 22, that when subjected to artinic radiation in the order of 0.109 joules per square centimeter through the phototransparency, the liquid polymer layer will become polymerized to a depth of at least 30% of its thickness on the side adjacent the transparency and will be unpolymerized on the side exposed to air. As shown; typically, the 0.003 in (0.007 cm) layer carried on the phototransparency 20 has two thirds of its thickness polymerized and one third remaining in liquid photopolymer unpolymerized form to provide when superimposed on a previously deposited liquid polymer layer surface to surface liquid photopolymer contact with the lower layer 19 of the liquid paste consistency photopolymer. This procedure insures that the wiring traces 13 will have a solder mask coating at least 0.002 in (0.005 cm) thick over all traces without starvation.

To clarify terminology as used herein, it is to be recognized that a liquid photopolymer is a photosensitive polymer composition which does not contain volatiles, but only solids, where the photoactive polymers in the unpolymerized (unexposed by actinic radiation) state are in liquid or unhardened form. When polymerized by actinic radiation, usually ultra violet radiation, the photopolymer then becomes hardened in the polymerized state, such as over the particular pattern carried by the phototransparency image, so that the unpolymerized liquid photopolymer can be washed out in a development step.

Thus, this invention provides a photopolymer solder mask layer for overlying fine, closely spaced wiring traces on a printed circuit board with a minimum depth of the solder mask covering thereover assured without starvation or thinning. Thus, the liquid solder mask polymer which has the character to be disposed on the printed wiring board in pastelike consistency to fill the gaps between the traces without air bubbles, even in undercut regions 23 alongside the wiring traces 13, and to form two superimposed layers in liquid to liquid surface interface, also assures thickness and quality of a solder mask overlying wiring traces.

The method provided herein of depositing a substantially constant thickness layer of liquid photopolymer of the aforesaid characteristics on the phototool transparency and exposing that layer to enough actinic radiation through the phototransparency with the outer photopolymer surface exposed to air to polymerize a substantial portion of the depth of the photopolymer layer adjacent the phototransparency while leaving the outer surface exposed to air in liquid unpolymerized form provides assurance of the thick solder mask coating over circuit board wiring traces upon which the photopolymer is transferred. However, this requires a special photopolymer, later set forth, since commercially available photopolymers have such characteristics that exposure of one surface to air will prevent polymerization through the phototransparency to any appreciable depth with reasonable amounts of radiated energy.

This method, dependent upon special photopolymer characteristics, is characterized by the ability to preexpose the photopolymer layer on the phototransparency through the desired image with one surface exposed to air to permit polymerization through a part of the layer depth and a liquid opposite surface that has the property of conforming about wiring traces and other uneven surfaces, where the liquid part of the layer is when exposed through the phototransparency a second time to polymerize the coating through its entire depth and to secure the desired pattern of polymerized coating to the printed wiring board or other equivalent substrate, as a permanent coating. This is distinguished from known prior art preexposure techniques as set forth for example in U.S. Pat. No. 4,087,182 H. Aiba et al. May, 1978, wherein preexposure required both surfaces of the liquid photopolymer to be covered, and was for the entirely different purpose and effect of preliminarily activating the photopolymerizable material so that the time required for exposure through the image could be shortened.

In addition to the aforesaid characteristics of the particular photopolymer composition necessary for the purposes of this invention, namely the photosensitivity of the photopolymer which permits partial polymerization of a layer when one side is exposed to air, the flow or viscosity characteristics giving a pastelike consistency to the liquid photopolymer are also critical. So that it may be used directly on a printed wiring board over a specified area to cover wiring traces making the surface very uneven, the viscosity is in a restricted range. Also the viscosity is closely related to the thickness of the layer. Most of the commercially available liquid negative acting photopolymers thus have been specifically directed to very thin layers, such as a few microns. For providing the much thicker layers of greater than about 0.002 in (0.005 cm) for the processing of solder masks directly over wiring traces on a printed wiring board to be put on in liquid form, exposed to an image, developed and left permanently in place over wiring traces that frequently are as thick as 0.004 in (0.01 cm) and which are very fine and closely spared, typically with trace and substrate inter trace widths of 0.012 in. (0.03 cm), the flow characteristics are critical. Similarly the photopolymer need be capable of coating with a substantially constant thickness layer in the range of about 0.002 in (0.005 cm) to about 0.004 in. (0.01 cm). A simple and inexpensive way of doing this is by depositing from a mesh screen of a mesh between about 50 to 120. To meet both the above requirements of flow characteristics is difficult, particularly when considering that the critical range of viscosities is established by the screen mesh. Thus, if the desired pastelike consistency is too liquid, the photopolymer will drip through the mesh and leave in its place an air bubble, or a drop that is undesirable or which tends to build up with too much polymer as is the case when over through holes of a printed wiring board. On the other hand, if too thick, then screen mesh marks remain on the surface after deposit, again encouraging the formation of air bubbles, particularly if overlaid with another liquid layer as taught by this invention. The general viscosity objective is to maintain a deposited layer in place with a viscosity thickness that in the deposited depth, it will not run off or change position at the edges to destroy a high resolution pattern when the board is handled, turned over, etc. Also it must be thin enough in viscosity to flow into and around circuit crevises between wiring traces, including undercuts, without entrapping air bubbles.

Thus in order to practice this invention, a critical photopolymer is required, with respect to air presence, photo sensitivity, flow characteristics, screenability and other factors hereinafter discussed. For commercial practice in the field therefore, it is necessary that those mechanics skilled in printed wiring production techniques, but not in the chemistry and physics of photopolymers, be provided with a negative acting liquid solder mask photopolymer composition specially adapted to the manufacturing conditions required in order to be able to produce printed circuit wiring boards of acceptable quality. Such are not available heretofore, because the art has not demanded the same combination of photo properties, flow properties, layer thicknesses and solder mask characteristics such as stability at high temperatures, electrical insulation properties, adhesion and ability to place in situ and photo develop into a permanent coating over rough circuit trace contours.

In particular, the achievement of high resolution photo response with sharp straight edges and resolutions exceeding about 100 lines has not been attainable in printed circuit applications with liquid photopolymers. Dry polymers have thus been required where high resolution solder mask coatings are desired. Furthermore the relatively thick layers of above about 0.002 in (0.005 cm) thickness, and not uncommonly 0.006 in. (0.015 cm), that are required to cover wiring traces on printed wiring boards are difficult to photo polymerize throughout the thickness thereof with conventional liquid photopolymer compositions. It has been considered incompatible to expect high resolution from liquid photopolymers, and if this characteristic need be added to those foregoing, it is indeed a set of characteristics that would not be expected with prior art liquid photopolymer compositions.

In the development of present day printed wiring boards, they have become complex and expensive, and thus need be salvageable when there are defects in the photopolymer coating, exposing and developing process. For this reason, a polymer, the manufacturing process and intermediate resulting manufactured product elements must permit board salvage operations should any inspection show an unacceptable defect in the solder mask coating thereon. For this reason the present process has several steps and salvage can be effected simply at any time before a final curing step of hardening the solder mask layer permanently in place over the wiring traces of the printed circuit board. The photopolymer image for this reason then is preferably exposed to actinic radiation three separate times. The first as aforesaid is a partial exposure through the thickness of a liquid layer disposed on the phototransparency with one side of the layer exposed to the air during photo exposure through the phototransparency image to keep the air side in liquid form for flowing over and around the wiring traces. The second is with the transparency in place over the wiring traces and substrate where both surfaces are in air free contact for in depth exposure through the same phototransparency image to polymerize the entire thickness of the liquid polymer. This polymerization step cures the liquid layer through its entire depth over the same image pattern so that it may be developed by washing out the uncured liquid photopolymer but leaves the layer loosely bonded to the wiring board over the wiring traces. Thus, after inspection at the first step, a defective layer need not be superimposed over the wiring. Similarly after the first step, if inspections shows a defective solder mask layer, it may be stripped from the board and a new mask laid down. A third curing and securing radiation exposure step may be made without an interposed phototransparency to expose the deposited pattern in place on the board after development, if inspection shows a properly deposited solder mask. If this final cure step is done at the second step, it would make board salvage difficult should there be a defect in the solder mask. The polymer thus need be of a characteristic not only to be partially polymerized through its thickness, as aforesaid, but also which permits a second step polymerization which cures through the entire depth of the layer but which does not so securely bind the layer to the wiring board that it may not be stripped.

The photosensitivity is important in terms of energy applied to the photopolymer to polymerize it. Since it is desirable to use a flexible thin film transparency, the amount of heating in response to exposure radiation is very limited. Also standard and thus low cost radiation developing equipment using two mercury vapor lamps rated at 200 watts conveyance per linear inch is available. Thus the photosensitivity of the polymer need be matched to the capabilities of affordable processing equipment. In order to assure this, the photopolymer photo sensitivity is such that the results in the following examples may be attained. Since this invention is limited to a particular process with particular materials or specified dimensions, special tests in general are required to be meaningful. Thus the following conditions specify and define the unique combinational photo sensitivity properties necessary in the present invention.

For the first exposure step with one surface in air and a photopolymer coating thickness of 0.003 in (0.007 cm) on a thin film flexible polyester phototool 0.004 in. (01 cm) thick, the photo sensitivity is such that with 30 second exposure to a one kilowatt mercury vapor lamp at a lamp to phototool distance of 30 in. (75 cm) a polymerized layer of 0.002 in. (0.005 cm) thickness is formed next to the phototool and a layer 0.001 in. (0.003 cm) thick remains unpolymerized on the surface exposed to air. The radiation energy thus received by the photopolymer is 0.109 Joules per square centimeter.

For the second exposure step with photopolymer thickness of 0.006 in. (0.015 cm) and lamp power of 2.5 kilowatts at 18 inches (44 cm) spacing with an exposure time of 40 seconds the layer is polymerized through the depth and is bonded in place on the substrate. The radiation energy thus received by the photopolymer is 3.54 joules per square centimeter.

The cure depth characteristic is alternatively measured as a cure depth of 0.024 in. (0.06 cm) when conveyed at 10 feet (3.4 m) per minute past two tubular mercury vapor lamps, each rated at 200 watts per inch. The cure depth is satisfactory when there is no unpolymerized residue at 0.02 in. (0.05 cm) depth.

The desired photosensitivity level of a photopolymer may be established by the use of photosensitizers, such as those described in U.S. Pat. No. 3,824,104 H. A. Kloczewski, et al., Jul. 16, 1974.

The objective of high resolution greater than 100 lines with the relatively thick layers greater than about 0.002 in. (0.005 cm) in thickness and up to about 0.006 in. (0.015 cm), which is required to cover 0.004 in. (0.01 cm) thick wiring traces on a printed wiring board, is not a feature expected in prior art negative acting liquid photopolymer products. The status of prior art usage has led to commercial liquid photopolymers of low resolution, since they were either used in very thin layers heretofore, or for such purposes that poor resolution was an advantage as in the case of halftone dot matrix lithograph plates, etc. In order to achieve the nonconventional high resolution capabilities of this invention, and thereby provide the straight vertical edge sidewalls definable by the phototool image pattern, special attention therefore must be given to the formulation of photopolymer compositions, fully realizing that a whole range of other conditions must also be met to provide the comprehensive composition having all the combined characteristics demanded in the process of this invention.

It has been found that lack of resolution has come from absorption, diffusion and diffraction of the ultra violet light actinic radiation by ingredients such as pigments, thermal response agents and fillers used in the art for solder mask coating photopolymer compositions. For example, load, calcium carbonate and titanium dioxide significantly reduce resolution in layers of the thicknesses desired in this invention. Conversely with the radiation sources hereinbefore described, the fille silicon dioxide and the pigment phthalocyanine produce little adverse effect on the resolutions over the layer thicknesses herein disclosed.

Thus photopolymer solder mask compositions afforded by and used in accordance with the teachings of this invention need to have ingredients compatibly interacting to provide the characteristics of high resolution (above about 100 lines) through layers of about 0.002 in (0.005 cm) to about 0.006 in. (0.015 cm) with appropriate electrical insulation, together with adherance and thermal resistance properties when cured to produce a permanent solder mask coating on a printed wiring board. The viscosity and flow characteristics need to be such that wiring traces of up to 0.004 in (0.01 cm) thickness may be covered without entrapment of air bubbles when transferred in a substantially constant thickness layer from screens with a mesh range of about 50 to 120. Also the composition need have a photosensitivity characteristic such that energy and heat is low enough to work with thin polyester phototools and standard ultra violet lamp radiation sources, with polymerization and curing properties that are compatible with partial polymerization through a layer thickness, and two successive exposure cycles through a phototool image. A near 100% non volatile composition that does not change dimension significantly during processing and which in its liquid or unpolymerized (unexposed) form has a pastelike viscosity stably remaining in place where screened as a substantially constant thickness layer on a printed wiring board for handling and inspection during several manufacturing steps in converting the polymer in situ to a permanent high resolution solder mask coating pattern firmly secured to the wiring board over wiring traces thereon.

To attain these specific objectives related to the specific printed wiring board solder mask requirements, the usual viscosity and flow characteristics of the liquid photopolymer cannot be meaningful. Thus, the same conventional viscosity measurements can lead to a wide range of conditions because of the rheological and trixiotropic properties of liquid photopolymers, many of which are unacceptable in the required flow characteristics of this invention.

Accordingly an easily applied test of the desired flow characteristics of the pastelike consistency photopolymers of this invention involves a test printed wiring board over which the liquid polymer is deposited. Thus, the viscosity and flow characteristics demanded by this invention are met if 0.004 in. (0.01 cm) thick wiring traces 0.012 in. (0.03 cm) wide, separated by 0.012 in. (0.03 cm) spacings, are coated with the photopolymer from a 60 mesh polyester screen fabric and there are no mesh marks or air bubbles that remain on the surface and a uniform color is seen over the coating thereby indicating a substantially constant thickness coating over the rough surface.

Production speed is an important quality. Thus the photopolymer composition preferably includes a surfactant, or otherwise controls bubble formation and surface tension, providing the characteristics of removing any mesh marks or bubbles from the screening step within a specified time period such as less than 30 seconds.

In general bubble formation and retention is undesirable for several reasons. Thus, bubbles adjacent wiring traces of substrate spaces affect the adherance quality. Entrapped bubbles disperse and diffract actinic radiation and thus affect resolution. Surface bubbles, and mesh marks which make entrapped bubbles when two liquid layers are superimposed as in this invention, not only affect visual appearance undesirably, but can cause solder interface problems in a solder mask. Thus freedom from either entrapped bubbles, bubble formation, or surface bubbling is a characteristic of the polymers afforded by this invention.

Reference to FIG. 2 will afford an understanding of the advantages of the procedures and materials afforded b this invention. Since liquid photopolymers in the unpolymerized form are displaceable, it is expected as shown in FIG. 1 that deposited layers will conform to the contour of the rough wiring board surface shaped by the protruding wiring traces. Also they have the characteristic that when cojoined by a mating blade such as by a squeegee the force tends to smash down the coating on top of the wiring traces and thus cause starvation or thinning of the solder mask layer coating thickness over the conductor traces, which obviously reduces the quality of the solder mask permanent coating. Also the uneven contour is undesirable in some instances, such as in the formation of multiple layered printed wiring boards, where each layer should start from an identifiable flat planar level. Thus the role of the photo tool in providing a flat planar surface, similar to that in my U.S. Pat. No. 4,424,089, aforesaid, in combination with the hereinbefore described technique of partially polymerizing the layer next to the phototool through a portion of its thickness, produces a flat surface over the wiring traces 13 that cannot be starved and that has a minimum thickness equal to that of the polymerized depth of the outer photopolymer layer 14'. Also the advantage of the merging of two liquid state polymer surfaces in an air bubble free contour following procedure step is retained. Thus advantageously this invention produces a superior technique, product, polymer and advance in the liquid photopolymer solder mask art. Examples of photopolymer compositions meeting the requisites of this invention follow.

EXAMPLE 1

A photoimaging quality solder mask negative acting photopolymer composition embodying the invention has the following consistency:

| | |
|---|---|
| Urethane-acrylate | 50.0 |
| Aromatic Diacrylate | 8.0 |
| Aliphatic Triacrylate | 10.0 |
| Tripropylene Glycol Diacrylate | 16.0 |
| Pentaerythritol 3-Mercaptopropionate | 5.0 |
| Hexanediol Diacrylate | 0.6 |
| Surfactant | 0.94 |
| Fumed Silica of Micron Size | 3.98 |
| Pigment | 0.15 |
| Hydroquinone | 0.08 |

All ingredients are shown as percentages by weight. An acceptable surfactant is available from Monsanto by the trade name "Modaflow".

This composition at an UV exposure of 0.6 joules per square cm. has a cure depth of 19.5 mils (0.05 cm) with a tack free surface of pencil hardness 4H and resistance to methylene chloride immersion greater than ten minutes. This exposure is obtained by passing a coated specimen under three 200 watt per inch UV lamps at a rate of twelve feet per minute.

The solder mask has the following set of properties:
smooth glossy surface;
post-solder methylene chloride resistance greater than ten minutes;
excellent adhesion over copper after 20 second dip in a 260° C. solder pot;
good screen transfer of a film thickness of about 0.003 in. (0.007 cm) from a 60 mesh screen, without surface ridges or surface air bubbles after a period of twenty seconds;
a Brookfield viscosity at 22° C. and 100 RPM of approximately 12,500.

EXAMPLE 2

Commercially available photopolymer solutions for use with 200 screen meshes and the like, are conformed to desired viscosity by addition of fumed silica; were conformed where unacceptable to satisfactory depth of cure with one surface exposed to air by addition of up to 2 parts of photo-initiators such as Solex UV initiator UV 611 available from Advance Processing and Supply Corp.; were defoamed by addition of up to 0.1 part of BYK-052 defoamer, a surfactant available from BYK-Mallinekrodt Co., when surface bubbles did not dissipate after about ten seconds, and by adding up to 4 parts of hexanediol diacrylate.

EXAMPLE 3

For any of those solutions of Example 2 that had photopolymer compositions with poor adhesion to copper surfaces, a dry B-stage epoxy powder that does not dissolve in the photopolymer composition but remains suspended, which becomes polymerized only after a threshold temperature. During the processing stage this serves as a filler which acts in attaining the hereinbefore specified viscosity range. Typically 0.1 part is used. The copper to polymer bonding surface is generated by a final cure baking cycle at 275° F. for 30 minutes. This liquifies the epoxy and bonds the epoxy sites to the copper surface forming a composite bonding structure reinforcing that of the polymer. Dielectric strength is also increased.

A suitable such epoxy powder is available as Corvel ECA1555 from The Polymer Corp. of Reading, Pa.

Having therefore improved the state of the art, those features of novelty believed descriptive of the spirit and nature of the invention are defined with particularity in the following claims.

I claim:

1. A photopolymer layer for overlying the rough surface of wiring traces on a printed circuit board and assuring a minimum depth of coating to be disposed thereover, comprising a phototool transparency having an image pattern thereon, a liquid photopolymer layer thereon of substantially constant thickness of greater than about 0.001 in. (0.0025 cm) having a portion thereof to a depth of greater than about 0.0007 in. (0.0002 cm) adjacent the transparency polymerized by actinic radiation through the transparency in a pattern corresponding to that of said image, and the remainder of said photopolymer layer in unpolymerized liquid polymer form.

2. A photopolymer layer as defined in claim 1 with only one surface exposed to the presence of air and the other surface in contact with said phototool transparency, with the photopolymer having properties such that when subjected to actinic radiation in the order of 0.109 joules per square centimeter through the photo transparency the liquid polymer layer will become polymerized to a depth of at least about 30% of its thickness on the side adjacent the transparency and said unpolymerized polymer is on the side exposed to air.

3. A photo imaging quality solder mask photoresist negative acting liquid photopolymer composition of photoactive polymers including a monomer, a polymer, and a photosensitizer suitable for coating over the conductive layer supported by an insulating substrate of a printed wiring board, with improved interacting properties for producing high resolution layers of thicknesses greater than about 0.002 in (0.005 cm) to define permanent solder mask patterns cured throughout their depth over conductor traces of a printed wiring board without substantial surface irregularities, starvation over closely spaced finewiring traces or entrapment of air bubbles, characterized by:
electrical inclusion, adherance and thermal resistance properties when cured on said printed wiring board to produce a permanent solder mask layer,
photo-sensitive properties for curing a pattern extending throughout the depth of a layer of greater thickness than 0.002 in. (0.005 cm) and up to about 0.006 in. (0.015 cm) when exposed to actinic radiation through an interposed phototool image
photo resolution properties capable of 125 line resolution in the presence of photo radiation to a depth greater than 0.002 in (0.005 cm),
freedom from any significant percentages of volatiles removable from the photopolymer at any time before attaining the permanent solder mask condition,
flow characteristics in the liquid polymer unexposed condition permitting deposit from screens with a mesh in the range of about 50 to 120 over wiring traces of a thickness up to about 0.004 in. (0.01 cm) without screen mesh marks on the surface and without embedded air bubbles, and
polymerization characteristics in the presence of photo-radiation with only one surface of a layer of about 0.002 in. (0.005 cm) to 0.004 in. (0.01 cm) of the unpolymerized liquid photopolymer exposed to air produring polymerization to a depth of greater than 25% leaving on the air exposure side an unpolymerized depth of greater than 25% of its thickness.

4. A photoresist as defined in claim 1 having photo-sensitizing agents that provide in a primary layer of unexposed photopolymer of the order of 0.003 in. (0.008 cm) thick photo exposed with actinic light energy of 0.109 joules per square cm through a phototool image in contact therewith on one side to exclude air with the other side exposed to air produces polymerization of a pattern corresponding to the image in a layer about 0.002 in. 0.005 cm) deep with a substantially unpolymerized layer of about 0.001 in. (0.003 cm) in depth on the side exposed to air.

5. A photoresist as defined in claim 2 having the ingredients reactable together so that the pattern selectively polymerized through the phototool when exposed a second time to actinic light through the phototool with air excluded from both sides will be selectively polymerized substantially through the entire thickness of the layer.

6. A photoresist as defined in claim 1 having a viscosity where an unpolymerized screen deposited primary layer on a printed circuit board when coated with another screen deposited similar layer of greater than about 0.002 in. (0.005 cm) thickness will be disposed in an unpolymerized face to face bubble free photoresist junction face, and having interacting ingredients imparting a photo sensitivity such that the entire thickness of greater than about 0.004 in. (0.01 cm) of which will be polymerized through its entire thickness by actinic light energy of about 3.54 joules per square inch.

7. A photoresist as defined in claim 1 with interacting materials imparting photo image exposure sensitivity in the presence of air is approximately such that the photoresist is polymerized to a depth of about 0.024 in. (0.06 cm) when subjected to actinic light energy of 3.5 joules per square centimeter.

8. A photoresist as defined in claim 1 deposited by screen printing over the conductive lamination on the insulating substrate of a printed wiring board in a photopolymer layer greater than about 0.001 in. (0.0025 cm) in thickness over conductive circuit traces of a height greater than about 0.002 in. (0.005 cm) and distributed on an insulating substrate in a substantially constant thickness layer over traces and insulating substrate without air bubbles entrapped alongside the traces.

9. A photoresist as defined in claim 8 having a second photopolymer layer thereover of a thickness greater than about 0.001 in. (0.0025 cm) superimposed by screen printing in liquid paste consistency face to face contact over the constant thickness said layer in an air bubble free surface junction to form a composite layer greater than about 0.002 in. (0.005 cm) in thickness without either intermediate bubbles within the layers or screen marks or bubbles on the surface thereof.

10. A photoresist with properties explicitly interacting to produce printed wiring board permanent solder mask overlays on conductive layer surfaces over an insulating substrate in a constant thickness layer with smooth surface texture of the order of about 0.002 in. to 0.003 in. (0.005 to 0.008 cm) layer thickness attained by mesh screen deposit from screens in the range of approximately 50 to 120 mesh, comprising in combination, a negative acting liquid photopolymer of photo imaging quality capable of attaining 125 line resolution free of volatiles comprising a mixture of a monomer, a polymer, a photosensetizer and with ingredients selected to prevent diffusion or diffraction of actinic radiation used to polymerize the photoresist, which when photo imaged and cured in place over said conductive layer permanently adheres as a solder mask layer defined in high resolution from a phototool image, said mixture being in liquid photo polymer form with a paste consistency viscosity in its unpolymerized state when deposited from the screens onto the conductive layer, with the viscosity of the paste providing over said range of screen meshes the property of self smoothing out of mesh marks without retention of air bubbles introduced by the screen deposit step and having flow characteristics when deposited over conductor traces in said conductive layer of a height as high as 0.004 in. (0.011 cm) and having traces as narrow as 0.012 in. (0.03 cm) trace and with similar space widths between traces for attaining the same coating thickness over the traces and interspersed spaces as indicated by uniform color with the property of attaining a photoimage resolution of 125 lines throughout the layer thickness when photo imaged in place upon the printed wiring board, and with after curing properties capable of providing a permanent heat resistant solder mask overlay without surface defects from screen marks or entrapped bubbles having a pattern characterized by substantially straight vertical sidewalls perpendicular to the substrate.

11. A photopolymer as defined in claim 10, having mixed therewith a dry B-stage epoxy powder that does not dissolve in the polymer composition but which polymerizes at a threshold temperature greater than 150° F.

* * * * *